United States Patent
Yuan et al.

(10) Patent No.: US 11,404,594 B2
(45) Date of Patent: Aug. 2, 2022

(54) POSITIVE-INTRINSIC-NEGATIVE (PIN) PHOTOSENSITIVE DEVICE, MANUFACTURING METHOD THEREOF, AND DISPLAY PANEL

(71) Applicant: Wuhan China Star Optoelectronics Technology Co., Ltd., Hubei (CN)

(72) Inventors: Jianfeng Yuan, Hubei (CN); Fei Ai, Hubei (CN); Jiyue Song, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 59 days.

(21) Appl. No.: 17/263,943

(22) PCT Filed: Jun. 24, 2020

(86) PCT No.: PCT/CN2020/097885
§ 371 (c)(1),
(2) Date: Jan. 28, 2021

(87) PCT Pub. No.: WO2021/248565
PCT Pub. Date: Dec. 16, 2021

(65) Prior Publication Data
US 2022/0190185 A1    Jun. 16, 2022

(30) Foreign Application Priority Data
Jun. 11, 2020 (CN) .................. 202010533493.0

(51) Int. Cl.
*H01L 31/105* (2006.01)
*H01L 27/144* (2006.01)
(Continued)

(52) U.S. Cl.
CPC ...... *H01L 31/1055* (2013.01); *H01L 27/1443* (2013.01); *H01L 27/305* (2013.01);
(Continued)

(58) Field of Classification Search
None
See application file for complete search history.

(56) References Cited

U.S. PATENT DOCUMENTS 11,322,643 B2 * 5/2022 Atanackovic ........... H01L 33/32
2004/0119129 A1 * 6/2004 Giboney ............... H01L 31/101
257/458
(Continued)

FOREIGN PATENT DOCUMENTS

CN   101438418    5/2009
CN   101944550    1/2011
(Continued)

*Primary Examiner* — Benjamin P Sandvik (57) ABSTRACT

A positive-intrinsic-negative (PIN) photosensitive device is provided. A p-type semiconductor layer composed of molybdenum oxide and having valence band energy between valence band energy of an intrinsic semiconductor layer and an upper electrode is used to replace a p-type semiconductor layer used in a conventional PIN photodiode, so that the PIN photodiode may be prepared without using borane gas. More, a difference between valence band energy of the p-type semiconductor layer and the intrinsic semiconductor layer is used to transport holes located in a valence band, so that it is unnecessary to use an active layer of a thin film transistor, so that the PIN photosensitive device may be stacked on the thin film transistor to reduce aperture ratio loss of a display panel.

20 Claims, 6 Drawing Sheets

(51) Int. Cl.
  *H01L 31/20* (2006.01)
  *H01L 31/0336* (2006.01)
  *H01L 51/42* (2006.01)
  *H01L 27/30* (2006.01)
  *H01L 51/00* (2006.01)
  *H01L 31/0224* (2006.01)
  *H01L 31/0256* (2006.01)

(52) U.S. Cl.
  CPC .......... *H01L 31/0336* (2013.01); *H01L 31/20* (2013.01); *H01L 51/4213* (2013.01); *H01L 51/4293* (2013.01); *H01L 31/022475* (2013.01); *H01L 51/0037* (2013.01); *H01L 2031/0344* (2013.01)

(56) References Cited

U.S. PATENT DOCUMENTS

| | | |
|---|---|---|
| 2007/0228414 A1 | 10/2007 | Kumar et al. |
| 2010/0276773 A1 | 11/2010 | Sasagawa et al. |
| 2011/0001051 A1 | 1/2011 | Tanaka |
| 2013/0056715 A1 | 3/2013 | Asami et al. |
| 2013/0284247 A1 | 10/2013 | Briceno et al. |
| 2016/0233266 A1 | 8/2016 | Hsu et al. |
| 2018/0301584 A1* | 10/2018 | Augusto ............ H01L 29/0653 |
| 2019/0067612 A1* | 2/2019 | Tashiro ............... H01L 51/4293 |
| 2021/0242361 A1* | 8/2021 | Igarashi .......... H01L 31/035281 |

FOREIGN PATENT DOCUMENTS

| | | |
|---|---|---|
| CN | 103000745 | 3/2013 |
| CN | 103762263 | 4/2014 |
| CN | 106684202 | 5/2017 |
| CN | 107017268 | 8/2017 |
| CN | 108281496 | 7/2018 |
| CN | 108447937 | 8/2018 |
| CN | 110444553 | 11/2019 |
| CN | 110808272 | 2/2020 |
| JP | 2012-146706 | 8/2012 |

* cited by examiner

POSITIVE-INTRINSIC-NEGATIVE (PIN) PHOTOSENSITIVE DEVICE, MANUFACTURING METHOD THEREOF, AND DISPLAY PANEL

RELATED APPLICATIONS

This application is a National Phase of PCT Patent Application No. PCT/CN2020/097885 having International filing date of Jun. 24, 2020, which claims the benefit of priority of Chinese Patent Application No. 202010533493.0 filed on Jun. 11, 2020. The contents of the above applications are all incorporated by reference as if fully set forth herein in their entirety.

FIELD AND BACKGROUND OF THE INVENTION

The invention relates to a photosensitive technology field, and in particular to a positive-intrinsic-negative (PIN) photosensitive device, a manufacturing method thereof, and a display panel capable of reducing aperture ratio loss of the display panel and are manufactured without borane gas.

Fingerprint identification technology has been widely used in small-sized and medium-sized panels. Particularly, because under-screen optical fingerprint identification technology has advantages of low manufacturing costs and a simple structure, major manufacturing companies have been actively developing them. However, an under-screen optical fingerprint identification module includes a plurality of positive-intrinsic-negative (PIN) photosensitive devices, and n-type and p-type semiconductor layers of the plurality of PIN photosensitive devices may currently only be prepared by using ion implantation and high-temperature processes such as excimer laser annealing and rapid thermal annealing. In this way, active layers of thin film transistors in a display area will be used frequently, so that the plurality of PIN photosensitive devices unable to be stacked on the thin film transistors, resulting in aperture ratio loss of a display panel. In addition, the need to retool machinery and add pipelines and chambers for borane gas when manufacturing the p-type semiconductor layers becomes a problem. Therefore, it is necessary to provide a PIN photosensitive device and a manufacturing method thereof capable of reducing aperture ratio loss of the display panel and also eliminates need for borane gas to solve the problems in the prior art.

An object of the present invention is to provide a positive-intrinsic-negative (PIN) photosensitive device, a manufacturing method thereof, and a display panel capable of reducing aperture ratio loss of the display panel and are manufactured without borane gas to solve the problems in the prior art.

SUMMARY OF THE INVENTION

To achieve the above-mentioned object, a first aspect of the present invention provides a positive-intrinsic-negative (PIN) photosensitive device, which comprises: a lower electrode, a PIN photodiode, and an upper electrode disposed in order, wherein the PIN photodiode comprises an n-type semiconductor layer, an intrinsic semiconductor layer, and a p-type semiconductor layer, and valence band energy of the p-type semiconductor layer is between valence band energy of the intrinsic semiconductor layer and the upper electrode.

Optionally, a material of the p-type semiconductor layer is any one of molybdenum oxide (MoOx), nickel monoxide (NiO), graphene oxide, or PEDOT:PSS.

Optionally, a material of the lower electrode is any one of molybdenum (Mo), titanium (Ti), molybdenum alloy (Mo/Al), titanium aluminum (Ti/Al), or molybdenum copper alloy (Mo/Cu).

Further, a material of the p-type semiconductor layer comprises molybdenum oxide having valence band energy of −5.2 eV.

Further, a material of the intrinsic semiconductor layer comprises amorphous silicon having valence band energy of −5.5 eV.

Further, a material of the upper electrode comprises indium tin oxide having valence band energy of around −5 eV.

Further, the upper electrode is a light-transmitting electrode and is configured to make light penetrate the upper electrode to reach the PIN photodiode.

A second aspect of the present invention provides a method for manufacturing a positive-intrinsic-negative (PIN) photosensitive device, the method comprises steps of:

forming a patterned lower electrode on a substrate;

forming a first insulation layer to cover the substrate and the lower electrode, and perforating the first insulation layer corresponding to a part of the lower electrode to form a first via;

forming a patterned n-type semiconductor layer and an intrinsic semiconductor layer on the lower electrode in order in an area corresponding to the first via;

forming a passivation layer to cover at least the intrinsic semiconductor layer, and perforating the passivation layer corresponding to the intrinsic semiconductor layer to form a second via;

forming a patterned p-type semiconductor layer on the intrinsic semiconductor layer in an area corresponding to the second via; and forming a patterned upper electrode to cover the p-type semiconductor layer, wherein valence band energy of the p-type semiconductor layer is between valence band energy of the intrinsic semiconductor layer and the upper electrode.

Optionally, the second via and the first via are patterned by using a same photomask.

Optionally, a photomask used for patterning the p-type semiconductor layer and a photomask used for patterning the n-type semiconductor layer and the intrinsic semiconductor layer are the same.

Further, before forming the patterned upper electrode to cover the p-type semiconductor layer, the method further comprises:

forming a second insulation layer to cover at least the p-type semiconductor layer, and perforating the second insulation layer corresponding to the p-type semiconductor layer to form a third via.

Optionally, the third via and the first via are patterned by using a same photomask.

Further, the method further comprises:

perforating the first insulation layer corresponding to another part of the lower electrode to form a first sub-via while forming the first via;

perforating the passivation layer corresponding to the first sub-via to form a second sub-via while forming the second via;

perforating the second insulation layer corresponding to the first sub-via and the second sub-via to form a third sub-via while forming the third via; and forming a cathode of the PIN photosensitive device by using a material forming the upper electrode while forming the upper electrode, and connecting the cathode to the lower electrode through the first sub-via, the second sub-via, and the third sub-via.

Further, after forming the patterned p-type semiconductor layer on the intrinsic semiconductor layer in the area corresponding to the second via, the method further comprises:

perforating the first insulation layer and the passivation layer corresponding to another part of the lower electrode to form a via; and forming a cathode of the PIN photosensitive device by using a material forming the upper electrode while forming the upper electrode, and connecting the cathode to the lower electrode through the via.

Optionally, a material of the p-type semiconductor layer is any one of molybdenum oxide (MoOx), nickel monoxide (NiO), graphene oxide, or PEDOT:PSS.

Further, a material of the p-type semiconductor layer comprises molybdenum oxide having valence band energy of −5.2 eV.

Further, a material of the intrinsic semiconductor layer comprises amorphous silicon having valence band energy of −5.5 eV.

Further, a material of the upper electrode comprises indium tin oxide having valence band energy of around −5 eV.

Further, the upper electrode is a light-transmitting electrode and is configured to make light penetrate the upper electrode to reach a PIN photodiode comprising the n-type semiconductor layer, the intrinsic semiconductor layer, and the p-type semiconductor layer.

A third aspect of the present invention provides a display panel, comprising a plurality of positive-intrinsic-negative (PIN) photosensitive devices and a thin film transistor array substrate having a plurality of thin film transistors, wherein the plurality of PIN photosensitive devices are stacked on the thin film transistors.

According to the present invention, a p-type semiconductor layer composed of such as molybdenum oxide and having valence band energy between valence band energy of an intrinsic semiconductor layer and an upper electrode is used to replace a p-type semiconductor layer used in a conventional positive-intrinsic-negative (PIN) photodiode, so that a PIN photodiode may be prepared without using borane gas. More, a difference between valence band energy of the p-type semiconductor layer and the intrinsic semiconductor layer is used to transport holes located in a valence band, so that it is unnecessary to use an active layer of the a thin film transistor, and a PIN photosensitive device provided by the present invention may be stacked on the thin film transistor to reduce aperture ratio loss of a display panel. Furthermore, two ways for manufacturing PIN photosensitive devices provided by the present invention are beneficial to reduce the number of photomasks and use of materials, thereby reducing manufacturing costs. It can be seen that the present invention is fully utilizable.

DESCRIPTION OF SPECIFIC EMBODIMENTS OF THE INVENTION

In order to make objectives, technical solutions and effects of the present invention more clear and specific, the present invention is described in further detail below with reference to appending drawings. It should be understood that specific embodiments described herein are only used to explain the present invention and are not intended to limit the present invention.

The following descriptions for respective embodiments refer to the appending drawings to illustrate embodiments of the present invention that can be implemented. Spatially relative terms mentioned in the present invention refer only to directions referring to the appending drawings. Therefore, the used spatially relative terms is configured to illustrate and understand the present invention, not to limit the present invention.

Figure 1:
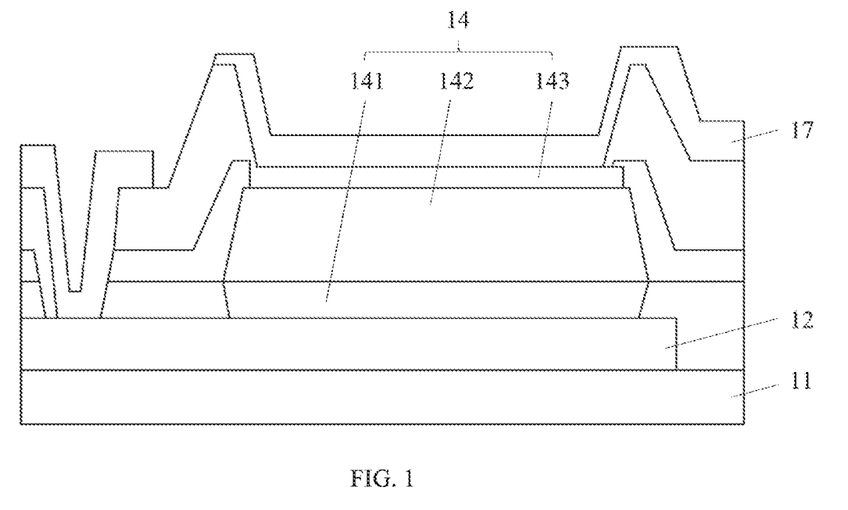
FIG. 1 is a schematic diagram showing a positive-intrinsic-negative (PIN) photosensitive device according to a first embodiment of the present invention.

Referring to FIG. 1, it is a schematic diagram showing a positive-intrinsic-negative (PIN) photosensitive device according to a first embodiment of the present invention. The PIN photosensitive device includes a substrate 11 and a lower electrode 12, a PIN photodiode 14, and an upper electrode 17, which are disposed on the substrate 11 in order, wherein the PIN photodiode 14 includes an n-type semiconductor layer 141, an intrinsic semiconductor layer 142, and a p-type semiconductor layer 143 along a direction away from the substrate 11 in order, and valence band energy of the p-type semiconductor layer 143 is between valence band energy of the intrinsic semiconductor layer 142 and valence band energy of the upper electrode 17.

In the present embodiment, the lower electrode 12 preferably is a non-light-transmitting electrode, which may be formed simultaneously while forming a gate electrode of a thin film transistor (not shown), so that a material of the lower electrode 12 may be molybdenum (Mo), titanium (Ti), molybdenum aluminum alloy (Mo/Al), titanium aluminum alloy (Ti/Al), or molybdenum copper alloy (Mo/Cu), and other highly-conductive materials. Moreover, the lower electrode 12 also has an effect of preventing light coming from a backlight source (not shown) from generating a leakage current in the PIN photodiode 14, so it is also used as a light shielding layer.

In the present embodiment, since silicon has many advantages such as stable properties and easy acquisition, materials of a p-type semiconductor layer, an intrinsic semiconductor layer, and an n-type semiconductor layer of a conventional PIN photodiode are all comprise silicon. However, polysilicon is usually adopted to be the materials of the p-type semiconductor layer and/or the n-type semiconductor layer while manufacturing the conventional PIN photodiode to facilitate transmission of a photocurrent, so that the p-type semiconductor layer or the n-type semiconductor layer composed of polysilicon are prepared while manufacturing an active layer of the thin film transistor in a display area with high-temperature processes such as excimer laser annealing and rapid thermal annealing. However, this makes the conventional PIN photosensitive device unable to be stacked on the thin film transistor, and results in aperture ratio loss of a display panel. In addition, the need to retool machinery and add pipelines and chambers for borane gas when manufacturing the p-type semiconductor layers becomes a problem, as it not only increases costs of manufacturing devices, but also creates safety concerns. Therefore, the n-type semiconductor layer 141 and the intrinsic semiconductor layer 142 use silicon as a material in the present invention, and effects of reducing aperture ratio loss of the display panel and manufacturing the PIN photosensitive device without borane gas are achieved by replacing the p-type semiconductor layer of the conventional PIN photodiode with molybdenum oxide (MoOx). In one embodiment, a material of the PIN photodiode may be selected according to different optoelectronic devices. For example, germanium has a characteristic of absorbing infrared light, so it is suitable for devices such as a ToF (time-of-flight) device.

Figure 2:
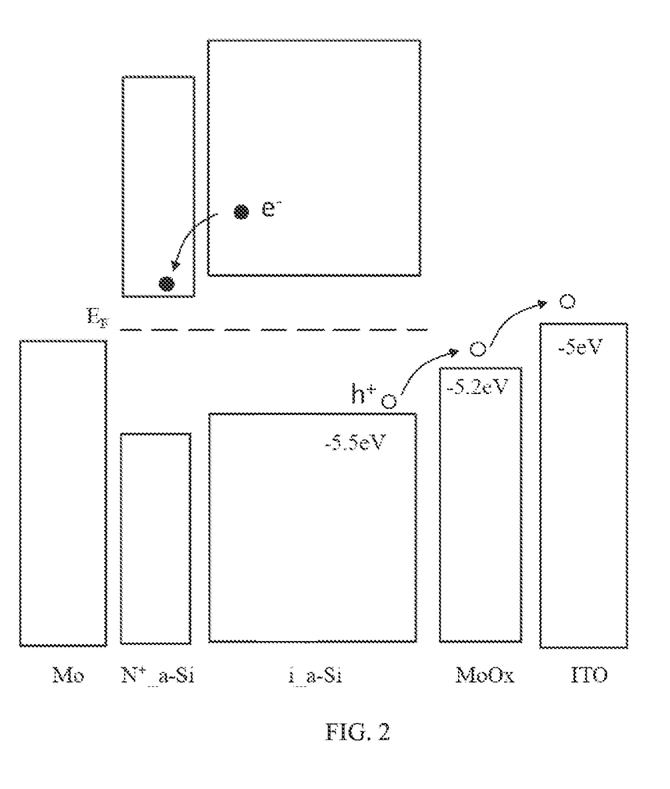
FIG. 2 is a schematic diagram showing a principle of the PIN photosensitive device according to the present invention.

In conjunction with FIG. 2, it is a schematic diagram showing a principle of the PIN photosensitive device according to the present invention. A plurality of electron/hole pairs are generated in a depletion region of the intrinsic semiconductor layer 142 when the PIN photodiode 14 is irradiated, and the holes will pass through the p-type semiconductor layer 143 to the upper electrode 17 (which is taken as an anode of the PIN photosensitive device in the present embodiment), and the electrons will pass through the n-type semiconductor layer 141 to the lower electrode 12, thereby generating a photocurrent. Specifically, the p-type semiconductor layer 143 with valence band energy between valence band energy of the intrinsic semiconductor layer 142 and valence band energy the upper electrode 17 is adopted preferably in the present invention, so that the holes may be transported by using a difference between valence band energy of the p-type semiconductor layer 143 and the intrinsic semiconductor 142 without utilizing polysilicon formed by high-temperature processes for transportation. Further, the intrinsic semiconductor layer 142 may be composed of amorphous silicon having valence band energy of −5.5 electron volts (eV), and the upper electrode 17 may be composed of indium tin oxide (ITO) having valence band energy around −5 eV, so that molybdenum oxide having valence band energy of −5.2 eV is adopted preferably in the present invention, and a difference between valence band energy of molybdenum oxide and valence band energy of amorphous silicon is used to transport the holes located in a valence band, as shown in FIG. 2. It can be understood that any material having valence band energy between valence band energy of the intrinsic semiconductor layer 142 and valence band energy of the upper electrode 17 can be used as the p-type semiconductor layer 143, such as nickel oxide (NiO), graphene oxide, or PEDOT:PSS. The upper electrode 17 is preferably a light-transmitting electrode, which makes it possible for light to penetrate the upper electrode 17 to reach the PIN photodiode 14.

In summary, it is possible to prepare the p-type semiconductor layer 143 of the PIN photodiode 14 without using borane gas, and since the active layer of the thin film transistor is unneeded, the PIN photosensitive device may be stacked on the thin film transistor in the present invention optionally. It can be understood that the present invention may be applied to a display panel (such as an organic light-emitting diode display panel or a liquid crystal display panel), and the display panel includes a plurality of PIN photosensitive devices and a thin film transistor (TFT) array substrate having a plurality of thin film transistors. The plurality of PIN photosensitive devices may be stacked on the thin film transistors.

The substrate 11 may be the thin film transistor array substrate.

Figure 4A:
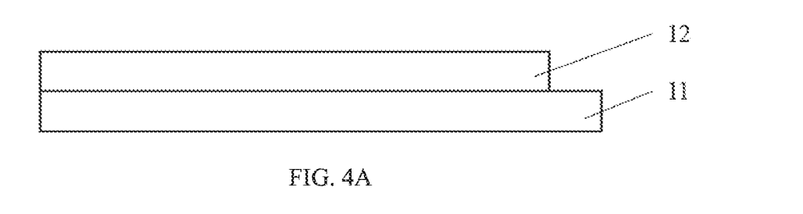
FIGS. 4A-4G are schematic diagrams showing a method for manufacturing the photosensitive device according to the first embodiment of the present invention.

In conjunction with the above descriptions and FIGS. 3 and 4A-4G, FIG. 3 is a flowchart of steps for manufacturing the PIN photosensitive device according to the first embodiment of the present invention, FIGS. 4A-4G are schematic diagrams showing a method for manufacturing the photosensitive device according to the first embodiment of the present invention. The manufacturing method includes steps of:

Step S11 (as shown in FIG. 4A): forming a patterned lower electrode 12 on a substrate 11.

Figure 4B:
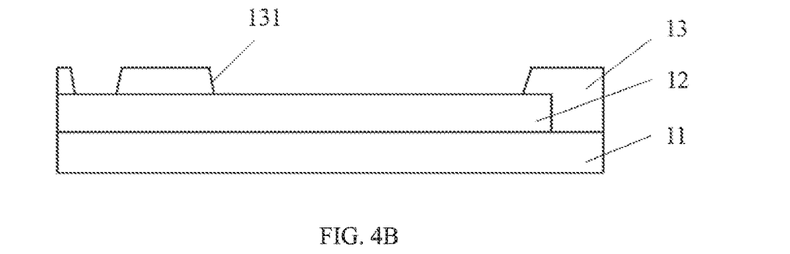

Step S12 (as shown in FIG. 4B): forming a first insulation layer 13 to cover the substrate 11 and the lower electrode 12 and perforating the first insulation layer 13 corresponding to a part of the lower electrode 12 to form a first via 131.

In this step, the first insulating layer 13 may be formed simultaneously with a gate insulation layer of a thin film transistor, and a material of the first insulating layer 13 may be silicon oxide (SiOx), nitrogen oxide (SiNx), silicon oxynitride (SiOxNy), and oxide silicon/nitrogen oxide (SiOx/SiNx), and the like.

In this step, while forming the first via 131, the first insulation layer 13 corresponding to another part of the lower electrode 12 is provided with a first sub-via (unmarked).

Figure 4C:
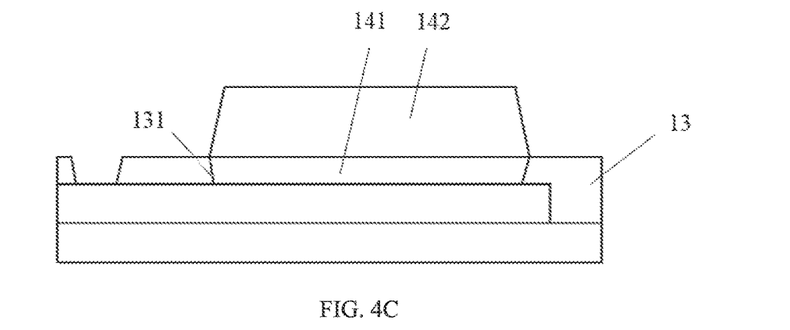

Step S13 (as shown in FIG. 4C): forming a patterned n-type semiconductor layer 141 and an intrinsic semiconductor layer 142 on the lower electrode 12 in order in an area corresponding to the first via 131.

In this step, after continually forming a blanket n-type semiconductor layer and a blanket intrinsic semiconductor layer in an in-situ manner preferably, the patterned n-type semiconductor layer 141 and the intrinsic semiconductor layer 142 are formed in the area corresponding to the first via 131 by lithography and etching processes.

Figure 4D:
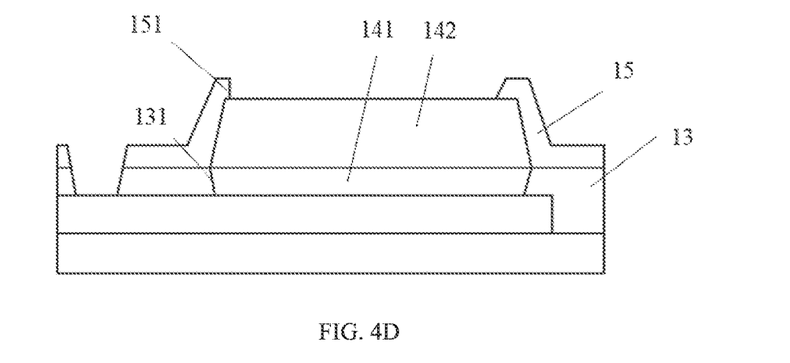

Step S14 (as shown in FIG. 4D): forming a passivation layer 15 to cover the above structure, and perforating the passivation layer 15 corresponding to the intrinsic semiconductor layer 142 to form a second via 151.

In this step, a material of the passivation layer 15 may be silicon oxide (SiOx), nitrogen oxide (SiNx), silicon oxynitride (SiOxNy), silicon oxide/nitrogen oxide (SiOx/SiNx), or the like.

In this step, the second via 151 and the first via 131 are patterned with lithography and etching processes by using a same photomask.

In this step, while forming the second via 151, the passivation layer 15 corresponding to the first sub-via is provided with a second sub-via (unmarked).

Figure 4E:
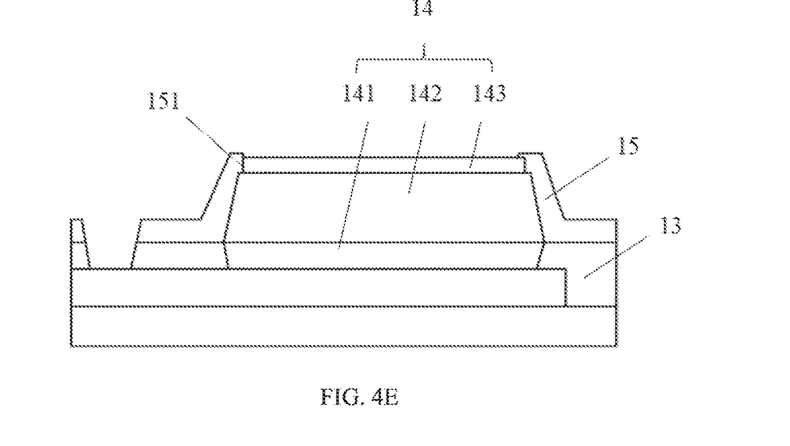

Step S15 (as shown in FIG. 4E): forming a patterned p-type semiconductor layer 143 on the intrinsic semiconductor layer 142 in an area corresponding to the second via 151.

In this step, a photomask used for patterning the p-type semiconductor layer 143 and a photomask used for patterning the n-type semiconductor layer 141 and the intrinsic semiconductor layer 142 are the same.

Figure 4F:
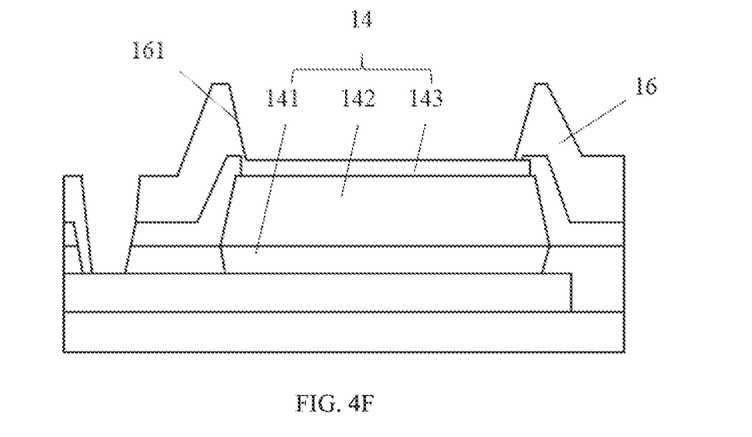

Step S16 (as shown in FIG. 4F): forming a second insulation layer 16 to cover the above structure, and perforating the second insulation layer 16 corresponding to the p-type semiconductor layer 143 to form a third via 161.

In this step, a material of the second insulating layer 16 may be silicon oxide (SiOx), nitrogen oxide (SiNx), silicon oxynitride (SiOxNy), silicon oxide/nitrogen oxide (SiOx/SiNx), or the like.

In this step, the third via 161 and the first via 131 are patterned with development and etching processes by using a same photomask.

In this step, while forming the third via 161, the second insulation layer 16 corresponding to the first sub-via and the second sub-via is provided with a third sub-via (unmarked).

Figure 4G:
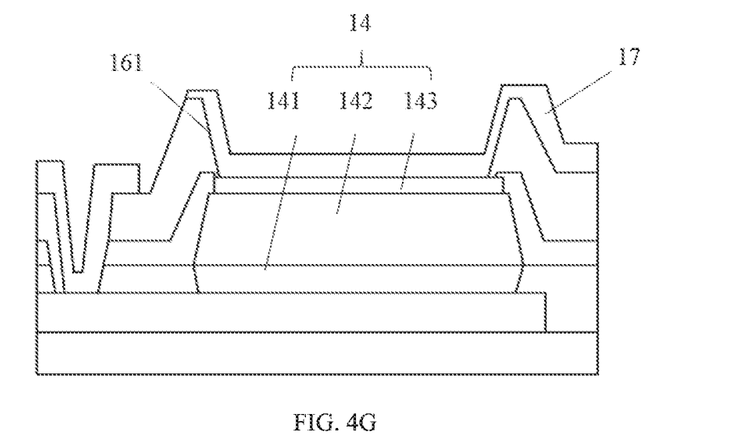

Step S17 (as shown in FIG. 4G): forming a patterned upper electrode 17 to cover the p-type semiconductor layer 143.

Figure 6A:
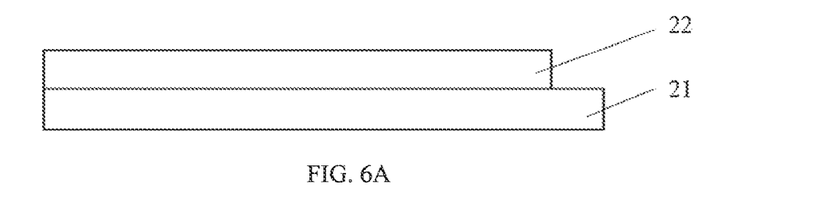
FIGS. 6A-6F are schematic diagrams showing a method for manufacturing the photosensitive device according to the second embodiment of the present invention.

In this step, the upper electrode 17 covering the p-type semiconductor layer 143 serves as an anode of the PIN photosensitive device which is configured to receive holes. A cathode (unmarked) of the PIN photosensitive device is formed by using a material forming the upper electrode 17 while forming the upper electrode 17, and the cathode is connected to the lower electrode 12 through the first sub-via, the second sub-via, and the third sub-via to make electrons transmit toward the cathode through the n-type semiconductor layer 141 and the lower layer electrode 12.

in conjunction with the above descriptions and FIGS. 5 and 6A-6F, FIG. 5 is a flowchart of steps for manufacturing a PIN photosensitive device according to a second embodiment of the present invention, FIGS. 6A-6F are schematic diagrams showing a method for manufacturing the photosensitive device according to the second embodiment of the present invention. The manufacturing method includes steps of:

Step S21 (as shown in FIG. 6A): forming a patterned lower electrode 22 on a substrate 21.

Figure 6B:
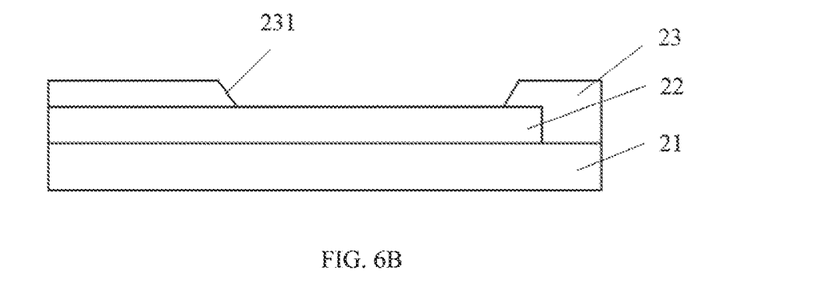

Step S22 (as shown in FIG. 6B): forming a first insulation layer 23 to cover the substrate 21 and the lower electrode 22, and perforating the first insulation layer 23 corresponding to a part of the lower electrode 22 to form a first via 231.

Figure 6C:
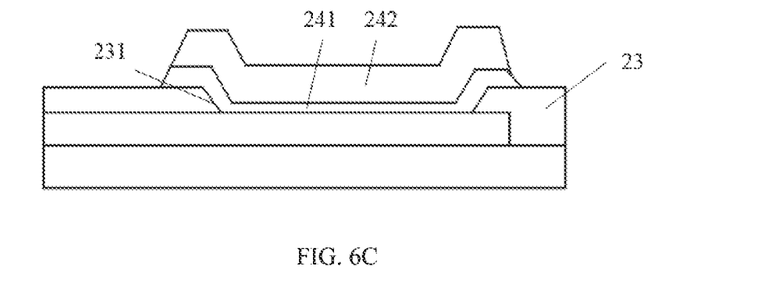

Step S23 (as shown in FIG. 6C): forming a patterned n-type semiconductor layer 241 and an intrinsic semiconductor layer 242 on the lower electrode 22 in order in an area corresponding to the first via 231.

Figure 6D:
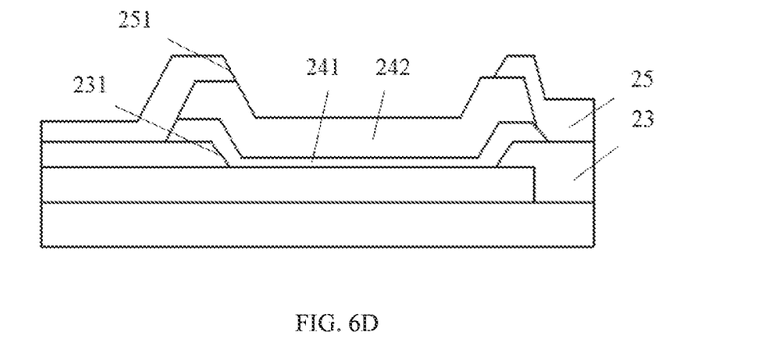

Step S24 (as shown in FIG. 6D): forming a passivation layer 25 to cover the above structure, and perforating the passivation layer 25 corresponding to the intrinsic semiconductor layer 242 to form a second via 251.

Figure 6E:
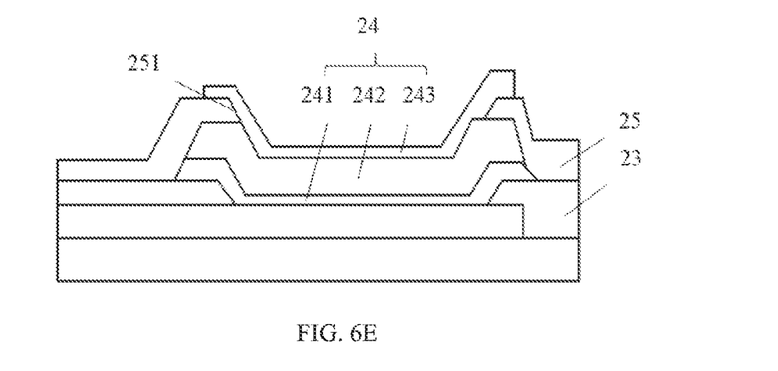

Step S25 (as shown in FIG. 6E): forming a patterned p-type semiconductor layer 242 on the intrinsic semiconductor layer 241 in an area corresponding to the second via 251.

In this step, after forming the patterned p-type semiconductor layer 242 on the intrinsic semiconductor layer 241, the first insulation layer 23 and the passivation layer 25 corresponding to another part of the lower electrode 22 are provided with a via.

Step S26 (as shown in FIG. 6): forming a patterned upper electrode 27 to cover the p-type semiconductor layer 243.

Figure 6F:
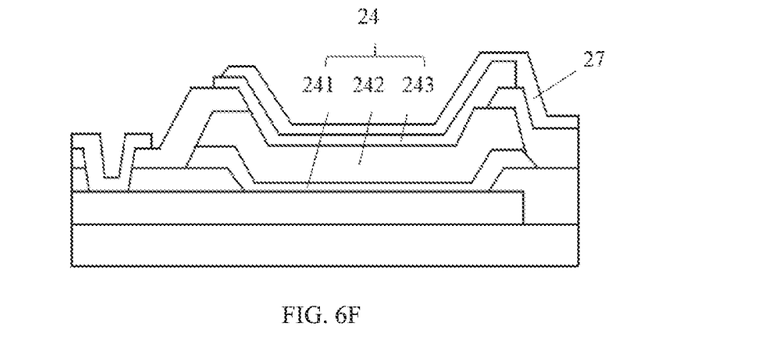

In this step, the upper electrode 27 covering the p-type semiconductor layer 243 serves as an anode of the PIN photosensitive device which is configured to receive holes. A cathode (unmarked) of the PIN photosensitive device is formed by using a material forming the upper electrode 27 while forming the upper electrode 27, and the cathode is connected to the lower electrode 22 through the via to make electrons transmit toward the cathode through the n-type semiconductor layer 241 and the lower layer electrode 22.

Figure 3:
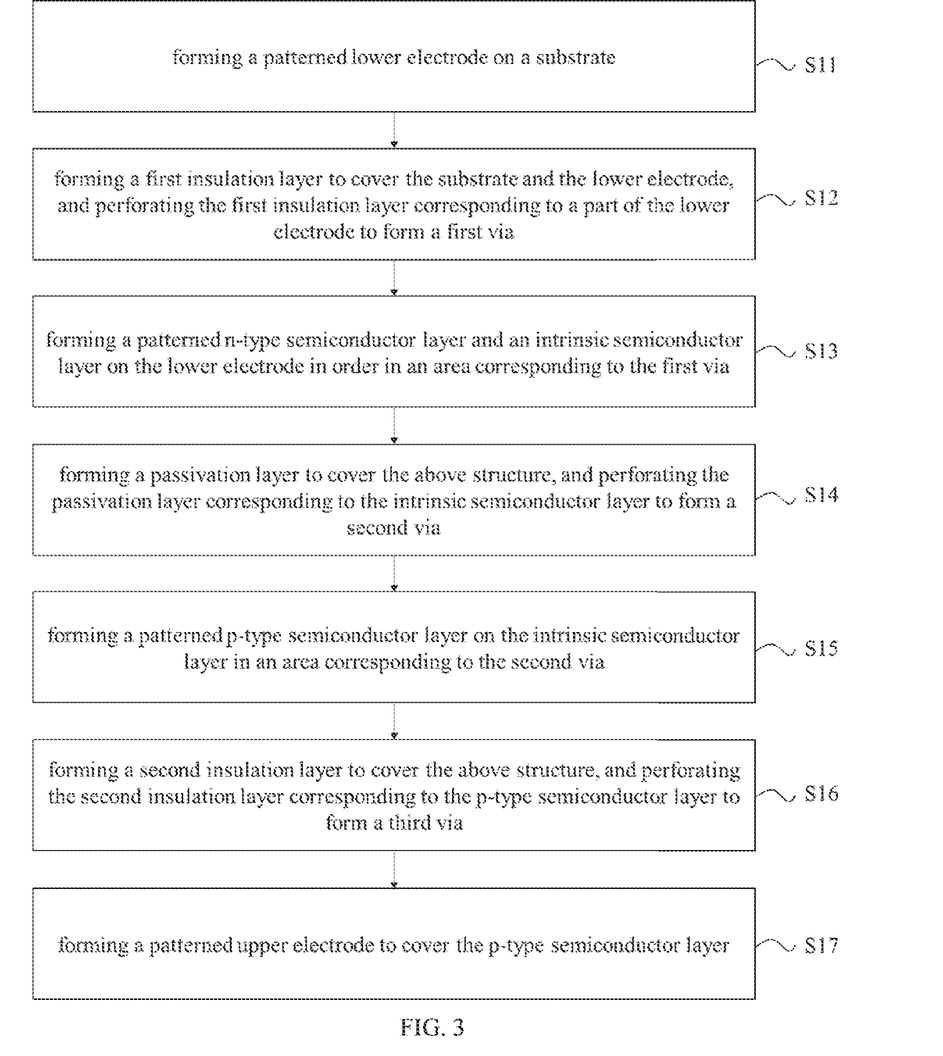
FIG. 3 is a flowchart of steps for manufacturing the PIN photosensitive device according to the first embodiment of the present invention.
Figure 5:
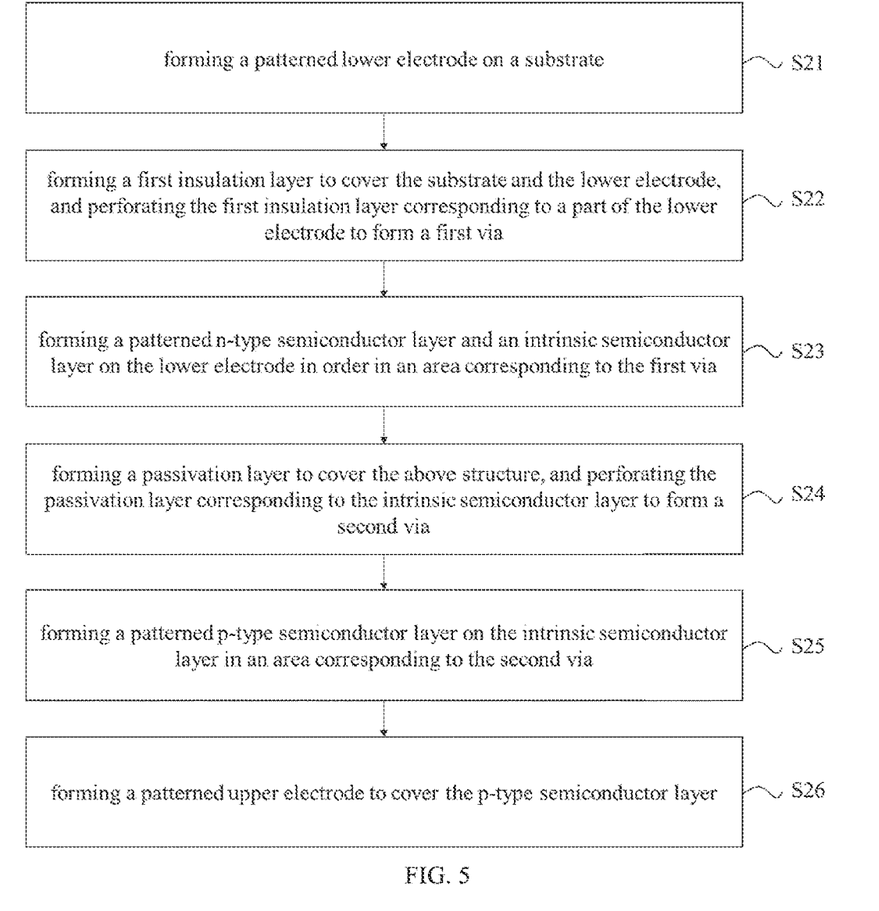
FIG. 5 is a flowchart of steps for manufacturing a PIN photosensitive device according to a second embodiment of the present invention.

In the present embodiment, a difference between the manufacturing method of the second embodiment and the manufacturing method of the first embodiment in the present invention is that photomasks used in steps S21 to S26 are all different, and steps of depositing and patterning the second insulation layer are omitted.

According to the present invention, the p-type semiconductor layer composed of such as molybdenum oxide and having valence band energy between valence band energy of the intrinsic semiconductor layer and the upper electrode is used to replace the p-type semiconductor layer used in the conventional PIN photodiode, so that the PIN photodiode may be prepared without using borane gas. More, the difference between valence band energy of the p-type semiconductor layer and the intrinsic semiconductor layer is used to transport holes located in the valence band, so that it is unnecessary to use the active layer of the thin film transistor, and the PIN photosensitive device provided by the present invention may be stacked on the thin film transistor to reduce the aperture ratio loss of the display panel. Furthermore, two ways for manufacturing PIN photosensitive devices provided by the present invention are beneficial to reduce the number of photomasks and use of materials, thereby reducing manufacturing costs. It can be seen that the present invention is fully utilizable.

Although the present invention has been disclosed above in the preferred embodiments, the above preferred embodiments are not intended to limit the present invention. For persons skilled in this art, various modifications and alterations can be made without departing from the spirit and scope of the present invention. The protective scope of the present invention is subject to the scope as defined in the claims.

What is claimed is:

1. A positive-intrinsic-negative (PIN) photosensitive device, comprising: a lower electrode, a PIN photodiode, and an upper electrode disposed in order, wherein the PIN photodiode comprises an n-type semiconductor layer, an intrinsic semiconductor layer, and a p-type semiconductor layer, and valence band energy of the p-type semiconductor layer is between valence band energy of the intrinsic semiconductor layer and the upper electrode.

2. The PIN photosensitive device as claimed in claim 1, wherein a material of the p-type semiconductor layer is any one of molybdenum oxide (MoOx), nickel monoxide (NiO), graphene oxide, or PEDOT:PSS.

3. The PIN photosensitive device as claimed in claim 1, wherein a material of the lower electrode is any one of molybdenum (Mo), titanium (Ti), molybdenum alloy (Mo/Al), titanium aluminum (Ti/Al), or molybdenum copper alloy (Mo/Cu).

4. The PIN photosensitive device as claimed in claim 1, wherein a material of the p-type semiconductor layer comprises molybdenum oxide having valence band energy of −5.2 eV.

5. The PIN photosensitive device as claimed in claim 4, wherein a material of the intrinsic semiconductor layer comprises amorphous silicon having valence band energy of −5.5 eV.

6. The PIN photosensitive device as claimed in claim 5, wherein a material of the upper electrode comprises indium tin oxide having valence band energy of around −5 eV.

7. The PIN photosensitive device as claimed in claim 1, wherein the upper electrode is a light-transmitting electrode and is configured to make light penetrate the upper electrode to reach the PIN photodiode.

8. A method for manufacturing a positive-intrinsic-negative (PIN) photosensitive device, comprising steps of:

forming a patterned lower electrode on a substrate;

forming a first insulation layer to cover the substrate and the lower electrode, and perforating the first insulation layer corresponding to a part of the lower electrode to form a first via;

forming a patterned n-type semiconductor layer and an intrinsic semiconductor layer on the lower electrode in order in an area corresponding to the first via;

forming a passivation layer to cover at least the intrinsic semiconductor layer, and perforating the passivation layer corresponding to the intrinsic semiconductor layer to form a second via;

forming a patterned p-type semiconductor layer on the intrinsic semiconductor layer in an area corresponding to the second via; and forming a patterned upper electrode to cover the p-type semiconductor layer, wherein valence band energy of the p-type semiconductor layer is between valence band energy of the intrinsic semiconductor layer and the upper electrode.

9. The method as claimed in claim 8, wherein the second via and the first via are patterned by using a same photomask.

10. The method as claimed in claim 8, wherein a photomask used for patterning the p-type semiconductor layer and a photomask used for patterning the n-type semiconductor layer and the intrinsic semiconductor layer are the same.

11. The method as claimed in claim 8, wherein before forming the patterned upper electrode to cover the p-type semiconductor layer, the method further comprises:

forming a second insulation layer to cover at least the p-type semiconductor layer, and perforating the second insulation layer corresponding to the p-type semiconductor layer to form a third via.

12. The method as claimed in claim 11, wherein the third via and the first via are patterned by using a same photomask.

13. The method as claimed in claim 11, further comprising:

perforating the first insulation layer corresponding to another part of the lower electrode to form a first sub-via while forming the first via;

perforating the passivation layer corresponding to the first sub-via to form a second sub-via while forming the second via;

perforating the second insulation layer corresponding to the first sub-via and the second sub-via to form a third sub-via while forming the third via; and forming a cathode of the PIN photosensitive device by using a material forming the upper electrode while forming the upper electrode, and connecting the cathode to the lower electrode through the first sub-via, the second sub-via, and the third sub-via.

14. The method as claimed in claim 8, wherein after forming the patterned p-type semiconductor layer on the intrinsic semiconductor layer in the area corresponding to the second via, the method further comprises:

perforating the first insulation layer and the passivation layer corresponding to another part of the lower electrode to form a via; and forming a cathode of the PIN photosensitive device by using a material forming the upper electrode while forming the upper electrode, and connecting the cathode to the lower electrode through the via.

15. The method as claimed in claim 8, wherein characterized in that a material of the p-type semiconductor layer is any one of molybdenum oxide (MoOx), nickel monoxide (NiO), graphene oxide, or PEDOT:PSS.

16. The method as claimed in claim 8, wherein a material of the p-type semiconductor layer comprises molybdenum oxide having valence band energy of −5.2 eV.

17. The method as claimed in claim 16, wherein a material of the intrinsic semiconductor layer comprises amorphous silicon having valence band energy of −5.5 eV.

18. The method as claimed in claim 17, wherein a material of the upper electrode comprises indium tin oxide having valence band energy of around −5 eV.

19. The method as claimed in claim 8, wherein the upper electrode is a light-transmitting electrode and is configured to make light penetrate the upper electrode to reach a PIN photodiode comprising the n-type semiconductor layer, the intrinsic semiconductor layer, and the p-type semiconductor layer.

20. A display panel, comprising a plurality of positive-intrinsic-negative (PIN) photosensitive devices as claimed in claim 1 and a thin film transistor array substrate having a plurality of thin film transistors, wherein the plurality of PIN photosensitive devices are stacked on the thin film transistors.

* * * * *

UNITED STATES PATENT AND TRADEMARK OFFICE
CERTIFICATE OF CORRECTION

PATENT NO.        : 11,404,594 B2
APPLICATION NO.   : 17/263943
DATED             : August 2, 2022
INVENTOR(S)       : Jianfeng Yuan et al.

It is certified that error appears in the above-identified patent and that said Letters Patent is hereby corrected as shown below:

On the Title Page

In item (73) Assignee:
"Wuhan China Star Optoelectronies Technology Co., Ltd."
Should be changed to:
-- Wuhan China Star Optoelectronics Technology Co., Ltd. --

Signed and Sealed this
Third Day of January, 2023

Katherine Kelly Vidal
*Director of the United States Patent and Trademark Office*